United States Patent
Kim et al.

(10) Patent No.: US 11,131,024 B2
(45) Date of Patent: Sep. 28, 2021

(54) FIXTURE COMPRISING MAGNETIC MEANS FOR HOLDING ROTARY SYMMETRIC WORKPIECES

(71) Applicant: Oerlikon Surface Solutions AG, Pfäffikon, Pfäffikon SZ (CH)

(72) Inventors: Dong-Ju Kim, Jeollabuk-do (KR); Christian Keplinger, Meiningen (AT); Armin Vester, Geisenheim (DE); Jurgen Becker, Geisenheim (DE)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 0 days.

(21) Appl. No.: 15/550,130

(22) PCT Filed: Feb. 15, 2016

(86) PCT No.: PCT/EP2016/053176
§ 371 (c)(1),
(2) Date: Aug. 10, 2017

(87) PCT Pub. No.: WO2016/128579
PCT Pub. Date: Aug. 18, 2016

(65) Prior Publication Data
US 2018/0030595 A1 Feb. 1, 2018

Related U.S. Application Data

(60) Provisional application No. 62/115,725, filed on Feb. 13, 2015.

(51) Int. Cl.
*C23C 16/458* (2006.01)
*H01J 37/32* (2006.01)
(Continued)

(52) U.S. Cl.
CPC ........ *C23C 16/4581* (2013.01); *C23C 14/505* (2013.01); *C23C 16/50* (2013.01); *H01J 37/32715* (2013.01); *H01J 2237/3321* (2013.01)

(58) Field of Classification Search
CPC ... C23C 16/4581; C23C 16/50; C23C 14/505; C23C 14/50; H01J 37/32715;
(Continued)

(56) References Cited

U.S. PATENT DOCUMENTS 2,884,698 A * 5/1959 Wursch .............. B23K 37/0435
24/303
6,299,740 B1 * 10/2001 Hieronymi .......... C23C 14/3407
204/192.12
(Continued)

FOREIGN PATENT DOCUMENTS

DE    3601543 A1 *  7/1987  ........... C23C 14/505
EP    1 881 086 A1   1/2008

OTHER PUBLICATIONS

Machine translation of Joergensen et al., EP 1881086 A1, published Jan. 23, 2008.*
(Continued)

*Primary Examiner* — Rakesh K Dhingra
*Assistant Examiner* — Laureen Chan
(74) *Attorney, Agent, or Firm* — Pearne & Gordon LLP

(57) ABSTRACT

A method for using a fixture system and a fixture system for holding workpieces or parts to be treated by a plasma assisted vacuum process, the fixture system including magnetic means which generate a magnetic field with a magnetic force which is high enough for holding the workpiece or part. The magnetic means of the fixture system are designed and arranged in such a manner that magnetic field lines of the generated magnetic field are largely confined to the space
(Continued)

Figure 1:
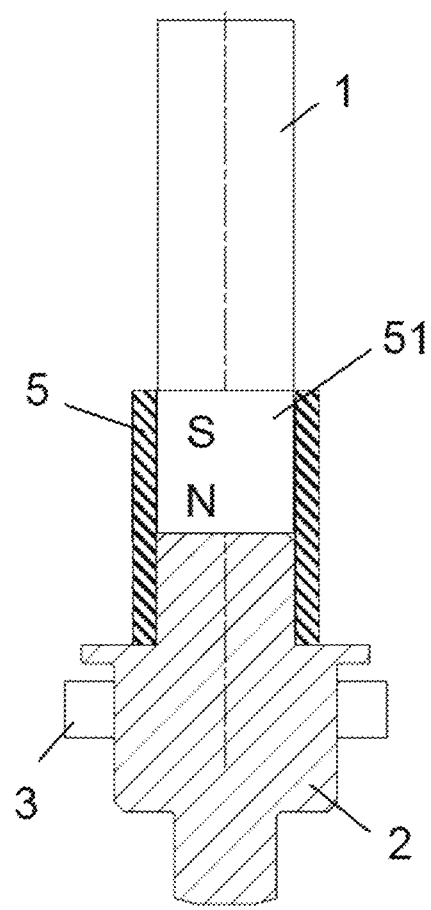

including the fixture system and the body of the workpiece or part, so that a generation of unintended plasma inhomogeneities caused by the magnetic field lines is avoided.

16 Claims, 4 Drawing Sheets

(51) Int. Cl.
*C23C 14/50* (2006.01)
*C23C 16/50* (2006.01)

(58) Field of Classification Search
CPC ...... H01J 2237/3321; H01F 7/00; H01F 7/02; B25B 11/002; F16B 2001/0035
See application file for complete search history.

(56) References Cited

U.S. PATENT DOCUMENTS

| | | | | |
|---|---|---|---|---|
| 6,471,837 B1 * | 10/2002 | Hans | ............. | B01J 3/03 118/500 |
| 6,566,992 B1 * | 5/2003 | Vicentelli | ............. | G09B 1/38 335/285 |
| 7,490,715 B2 | 2/2009 | Girg | | |
| 8,152,971 B2 | 4/2012 | Quinto | | |
| 2013/0276978 A1 * | 10/2013 | Bluck | ............. | C23C 14/042 156/345.3 |

OTHER PUBLICATIONS

English Machine Translation of Schmidt-Mauer DE3601543 retrieved from ESPACENET Dec. 4, 2018 (Year: 2018).*
Laughton, M.A. Warne, D.F.. (2003).Electrical Engineer's Reference Book (16th Edition)—8.7.3 Rare Earth Cobalt.(Year: 2003).*
Definition of austenitic stainless steel Schaschke, Carl. (2014). Dictionary of Chemical Engineering—austenitic stainless steel, (p. 20). Oxford University Press. (Year: 2014).*
Notice of Opposition to a European patent filed Jun. 26, 2019 (Year: 2019).*
Annex 1 to the Notice of Opposition to a European patent filed Jun. 26, 2019 (Year: 2019).*
D9.1 evidence: Email of Jun. 8, 2014 from Dr. Stefan Esser (CEO 4PVD) to Mr. Andre Hieke (employee of Ionbond Netherlands) (Year: 2014).*
D9.2 evidence: Angebot AN040787, Gearboxes 129 T18 and cover sleeves CB18 offer Jun. 8, 2014 (Year: 2014).*
English Machine Translation of D9.1 email of Jun. 8, 2014 retrieved from google translate on Oct. 23, 2020 (Year: 2020).*
D9.3 evidence: technical drawing sheet gearbox 129 T18 with CB18 cover sleeves Jun. 7, 2014 (Year: 2014).*
D9.4 evidence: technical drawing sheet gearbox 129 T18 with CB28 cover sleeves Apr. 4, 2014 (Year: 2014).*
D9.5 evidence: technical drawing of cover CB18 Jun. 8, 2014 (Year: 2014).*
D9.6 evidence: technical drawing gearbox 129 T18 with CB18 Sep. 21, 2018 (Year: 2018).*
D9.7 evidence: Purchase order of gearboxes 129 T18 and cover sleeves CB18, Jul. 14, 2014 (Year: 2014).*
D9.8 evidence: Delivery slip of delivery of gearboxes 129 T18 and cover sleeves CB18, Oct. 7, 2014 (Year: 2014).*
D9.9 evidence: Delivery slip of delivery of further gearboxes 129 T18, Oct. 21, 2014 (Year: 2014).*
D9.10 evidence: Delivery slip of delivery of further gearboxes 129 T18, Oct. 10, 2014 (Year: 2014).*
D9.11 evidence: Invoice of gearboxes 129 T18 and cover sleeves CB18, Oct. 7, 2014 (Year: 2014).*
D9.12 evidence: Invoice of gearboxes 129 T18, Oct. 21, 2014 (Year: 2014).*
D9.13 evidence: Invoice of gearboxes 129 T18, Oct. 14, 2014 (Year: 2014).*
D9.14 evidence Account statement proving payment of invoice D09.11 by Ionbond Netherlands BV, Dec. B, 2014 (Year: 2014).*
D9.15 evidence Account statement proving payment of invoice D09.12 by Ionbond Netherlands BV, Jan. 12, 2015 (Year: 2014).*
D9.16 evidence: Account statement proving payment of invoice D09.11 by Ionbond Netherlands BV, Dec. 8, 2014 (Year: 2014).*
D9.17 evidence: Account statement proving payment of invoice D09.12 by Ionbond Netherlands BV, Jan. 12, 2015 (Year: 2014).*
D9.18 evidence Account statement proving payment of invoice D09.13 by Ionbond Netherlands BV, Dec. 15, 2014 (Year: 2014 ).*
D9.19 evidence Invoice of gearboxes 129 T18 and cover sleeves CB18, Oct. 23, 2014 (Year: 2014).*
D9.20 evidence Invoice of further gearboxes 129 T18 and cover sleeves CB18, Oct. 23, 2014 (Year: 2014).*
D11.1 evidence Email from Dr. Stefan Esser to Dr. Andre Hieke, Sep. 10, 2014 with attachments (Year: 2014).*
English Machine translation of D11.1 evidence email retrieved from google Oct. 23, 2020 (Year: 2020).*
D11.2 evidence offer for Angebot AN040839, Cover sleeves CB28 Sep. 10, 2014 (Year: 2014).*
D11.3 evidence technical drawing for cover sleeve CB28 Sep. 10, 2014 (Year: 2014).*
D 11.4 evidence Purchase order of cover sleeves CB28, Jan. 23, 2015 (Year: 2015).*
D11.5 evidence: Delivery slip of delivery of cover sleeves CB28, Jan. 26, 2015 (Year: 2015).*
International Search Report for PCT/EP2016/053176 dated May 27, 2016.
Written Opinion for PCT/EP2016/053176 dated May 27, 2016.

* cited by examiner

FIXTURE COMPRISING MAGNETIC MEANS FOR HOLDING ROTARY SYMMETRIC WORKPIECES

The present invention relates to fixtures comprising a magnet arrangement in order to hold workpieces made of materials which can be attracted by magnetic forces and a method that uses the magnetic fixtures in plasma assisted vacuum processes. Furthermore the present invention relates to the use of the inventive fixtures for holding workpieces for conducting vacuum plasma treatments on surfaces of the workpieces.

The fixtures according to the present invention are particularly advantageous for holding workpieces which are to be coated with diamond like carbon (DLC) layers deposited by using plasma assisted chemical vapor deposition (PACVD), since the inventive fixtures allow avoiding the generation of undesirable side plasmas which typically negatively affect the characteristics of the DLC coatings formed on the workpiece surfaces.

STATE OF THE ART

Among the huge variety of reactive and non-reactive plasma processes, the plasma assistance is widely used to treat surfaces of tools, components, automotive parts, consumer products or medical devices by e.g. plasma surface activation, plasma etching, or plasma-assisted coating deposition as well as nitriding.

As one example the deposition of amorphous carbon coatings typically involves several plasma assisted process steps, like substrate etching in non-reactive atmosphere and deposition of amorphous carbon by plasma assisted vacuum deposition in reactive or non-reactive atmosphere.

Amorphous carbon coatings, consisting of a disordered network of carbon atoms with a mixture of both $sp^3$- and $sp^2$-coordinated bonds, are commonly referred as diamond like carbon coatings or DLC. Depending on their predominant bonding character, those coatings can exhibit tailor-made physical, chemical or tribological properties for a huge range of industrial applications such as protective coatings on cutting and forming tools, wear and friction reducing components and parts in automotive industry, decorative applications, or corrosion and wear minimizing applications in biomedical or consumer products. Among the different DLC coatings, including hydrogen-free (i.e. a-C coatings), hydrogenated or non-metal doped DLC (i.e. a-C:H coatings) or metal doped DLC (i.e. a-C:H:Me coatings), also tetrahedral amorhous carbon (i.e. ta-C coatings) can be found.

In order to achieve optimal results during application, various deposition techniques can be used to synthesize the DLC coating of choice on a wide range of substrate materials. Typically deposition methods such as physical vapor deposition (PVD) processes, chemical vapor deposition (CVD), pulsed laser deposition (PLD) or also cathodic arc evaporation (CAE) are known for deposition of carbon coatings, often with the aid of additional plasmas at the substrate surface during coating growth, which allows for lowering the deposition temperature and thus a broader range of substrate materials.

In most PVD processes, such as CAE, PLD or Sputtering, the whole coating material or at least coating constituents are transferred from a target material in a predominantly direct line of sight towards the workpiece. This typically results in a geometric coating thickness dependence from the substrate/workpiece geometry and/or workpiece alignment towards the particle flow during growth, which is significantly different to CVD or plasma assisted CVD (PACVD) processes which can provide a more or less uniform thickness on all free surfaces.

In general the substrates can be mounted in a deposition chamber by substrate holding means, referred as fixtures in the following, which all have in common to hold the substrate in an optimal position during deposition as well as during transfer into and from the deposition chamber. Depending on workpiece size and shape, coating material, and deposition parameters, the fixtures are often required to perform a single-, two- or even three-fold rotation during the deposition process with respect to the main symmetry axis of the deposition chamber.

While in some of the above mentioned plasma assisted vacuum process techniques the presence of the plasma at the workpiece is of subordinated importance, in PACVD the plasma conditions at the substrate surface of the workpiece to be coated become of major importance to reach good adhesion, homogenous coating properties, and thicknesses throughout the substrate surface. Especially for precision components or automotive parts with rotary symmetry along the main axis of the workpiece, such as e.g. needles, pins or plungers, a high uniformity of coating properties is inevitably necessary to achieve optimum results during application. For this reason the substrate mount becomes a crucial part of the overall process assembly in e.g. DLC coating processes, where plasmas are active at the tools or substrate surface during etching as well as the deposition process itself In many cases it is sufficient to use clamps, hooks or plate/cup-shaped fixtures to mount the workpiece in the deposition chamber and enable for substrate rotation as explained above. However shadowing effects in the vicinity of the contact zone between the mechanical substrate holder and the workpiece surface can lead to inhomogeneities of coating thicknesses and coating properties which has to be avoided wherever possible.

Recently, the use of two-fold rotating magnetic holders has been disclosed in U.S. Pat. No. 8,152,971B2 for mounting cemented carbide inserts. This approach enables for small contact zones between the workpiece and the substrate holder and avoids the mechanical interaction and thus shadowing effects at the functional surface of the coated part. As described in U.S. Pat. No. 8,152,971B2 the magnetic field enhancement at corners and edges was further found to increase the coating thickness at edges and corners of the cutting tools, which enabled for higher tool lifetime in turning operations. Unfortunately, such magnetic fixtures with undefined magnetic field lines are not suitable for deposition of DLC by PACVD processes on high-end automotive parts and precision components as the inhomogenous magnetic field of the substrate mount would lead to inhomogenous plasma conditions over the workpiece surface. Especially if the workpieces exhibit rotary symmetry and highest accuracy in terms of coating thickness distribution and homogenous coating properties over the surface of the coated parts this approach cannot meet the requirements.

A more sophisticated approach for mounting a high number of workpieces in an industrial batch coating machine is given in EP1881086A1, where the use of magnetic fixtures for chain pins is disclosed. It is shown that rotary symmetric steel parts can be mounted on substrate holders that exhibit each one permanent magnet in direct contact with the base of the workpiece. The holding forces between the magnetic fixture and the chain pin are chosen high enough to keep the pins in a constant position perpendicular to the first rotation axis of the rotating fixture holder. This approach however results in an inhomogenous magnetic field along the main axis or rotation axis of the pins due to the fact that the magnetic field lines expand from the magnetic south pole of the permanent magnet and "enter" at the base of the part throughout the workpiece and will find their end in the magnetic north pole, which is located on the opposite side of the contact zone between pin and fixture. This creates an "open" magnetic field over the workpiece and the magnetic fixture holder, which can be referred as magnetic leak and will inherently result in detrimental inhomogeneities of the magnetic field distribution and thus the surrounding plasma conditions along the workpiece axis.

The use of the above mentioned fixtures comprising magnetic means according to the state of the art unfortunately results in the generation of undesirable side plasmas during plasma assisted vacuum processes where a plasma is activated at the surfaces of the workpiece to be treated and also at surfaces of fixture parts, such as e.g. during deposition of DLC coatings by means of PACVD.

OBJECTIVE OF THE INVENTION

It is thus necessary to find a solution for avoiding generation of undesirable side plasmas during the conduction of plasma assisted vacuum processes, where a reactive or non-reactive plasma is active at the substrate surface in order to accomplish a homogenous treatment of the surface of the workpiece as well as production of coatings having homogeneous properties along the complete coated surfaces independent from the distance between the contact zone of the substrate to be coated and the holding fixture.

Another, not yet mentioned, requirement for the fixture is the stability against corrosive and abrasive media because of inevitable regular cleaning cycles of industrial coating equipment. This is often performed by sand blasting of the coated fixtures and/or wet chemical cleaning in aggressive media.

DESCRIPTION OF THE PRESENT INVENTION

The inventors had the idea of constructing a fixture system comprising magnetic means but arranged in such a manner that the magnetic forces between the magnetic fixture and the workpiece can be sufficiently high to hold the workpiece but at the same time with the least possible impact in the magnetic field along the main axis of the workpiece in order to avoid inhomogenous coating thicknesses and coating properties of the coated substrate resulting from inhomogenous plasma conditions (produced for example by generation of undesirable side plasmas) at the surface of the workpiece.

As already mentioned above quite often fixtures to hold workpieces comprise magnetic means in order to fix the workpiece to the holder. For some applications however it has to be avoided that the magnetic field of such magnetic means leak into the surrounding environment of the fixture. For example in the context of PVD or PACVD the magnetic field established by the magnetic means should not effect on plasma condition.

Especially as fixtures are typically moving within the coating chamber during deposition in order to establish a homogeneous coating, the plasma tends to be instable in the presence of additional magnetic fields originating from the fixtures.

The present invention discloses a fixture system which is in particular advantageous for holding parts or workpieces to be treated by means of a plasma assisted vacuum process, in particular during deposition of diamond like carbon films by PACVD. Especially rotary symmetric parts (e.g. plungers, needles or pins), are in the focus of the current invention as the fixture system uses a simple magnetic arrangement in order to hold the coated substrates without negatively affecting the plasma conditions at the substrate surface. Thereby the magnetic field is almost exclusively confined within the workpiece-magnet fixture contact zone and thus unintended side plasmas due to a magnetic leak are prevented in this region. This enables in particular for deposition of DLC coatings with optimum adhesion, highest coating thickness and property homogeneity along the surface of the coated part.

According to the solution of the present invention, a magnetic arrangement is set up in such a way that, together with the workpiece inserted into the fixture, the magnetic field is confined within a closed loop established by magnetic and/or ferromagnetic materials.

The present invention and preferred embodiments of the present invention will be explained in the following and exemplarily supported by figures. The following explanations and examples are not intended to limit the present invention but only to help to understand the invention and to show ways in which the invention can be put into practice.

FIG. 1 shows the setup of a fixture as commonly used today. With this setup the magnetic field is leaking into the neighborhood of the fixture and negatively affecting the plasma used during vapor deposition.

Figure 2:
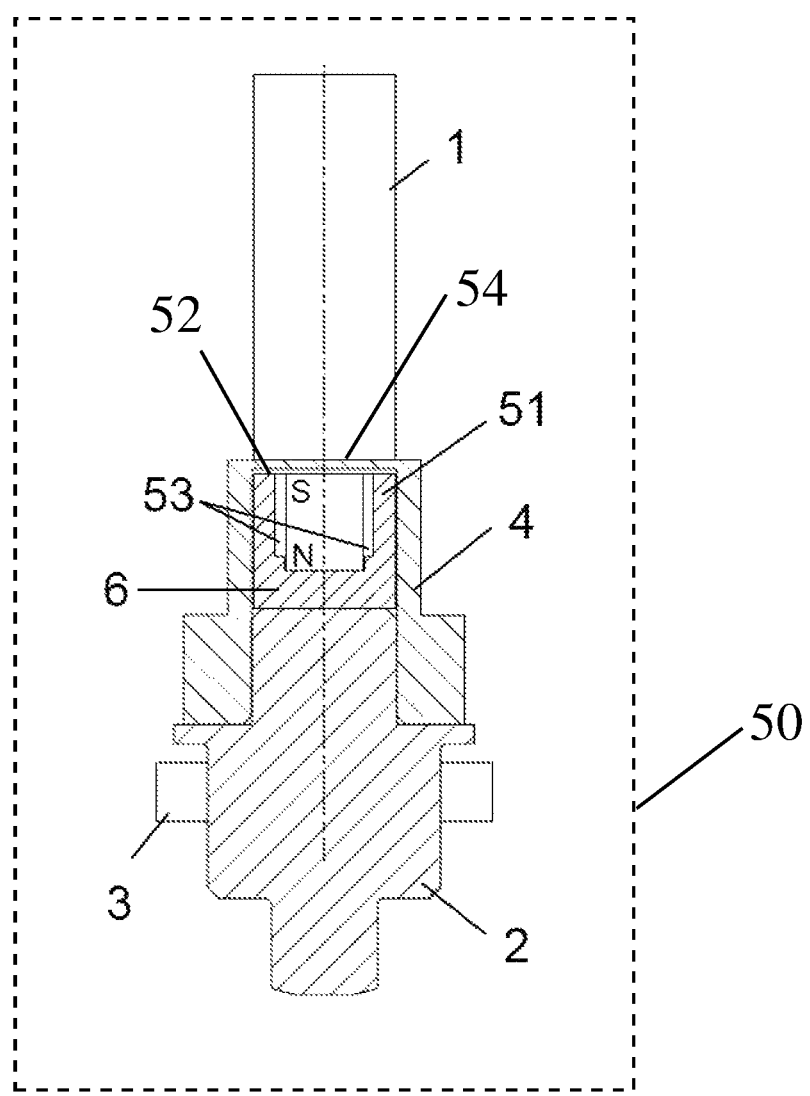

FIG. 2 shows one example of a coating or deposition chamber 50 and an exemplary magnetic fixture with a magnetic yoke 6, an air gap 53 between the permanent magnet 51 and the non-magnetic cover 4, and the air gap 53 having a distal air gap portion 52.

Figure 3:
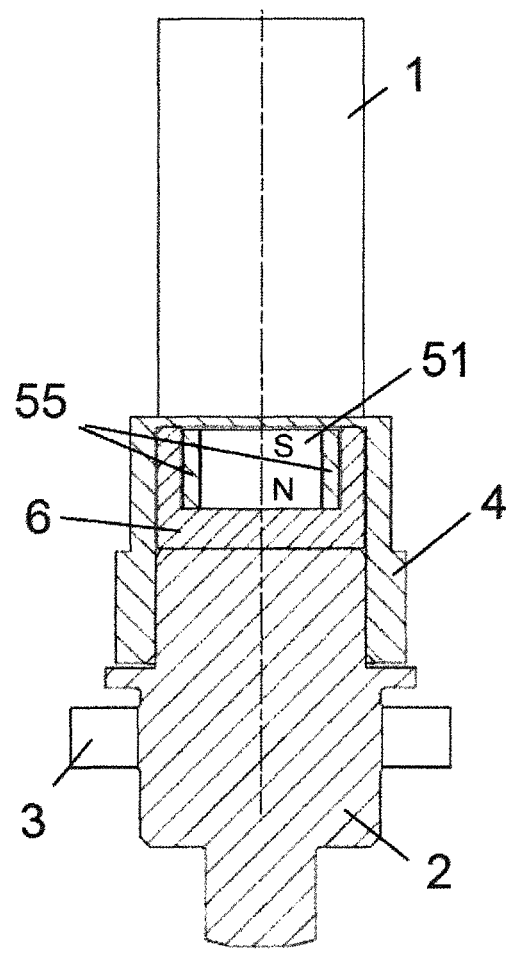

FIG. 3 shows one example of a magnetic fixture with a magnetic yoke 6 and a non-magnetic spacer 55 between the permanent magnet 51 and the non-magnetic cover 4.

Figure 4:
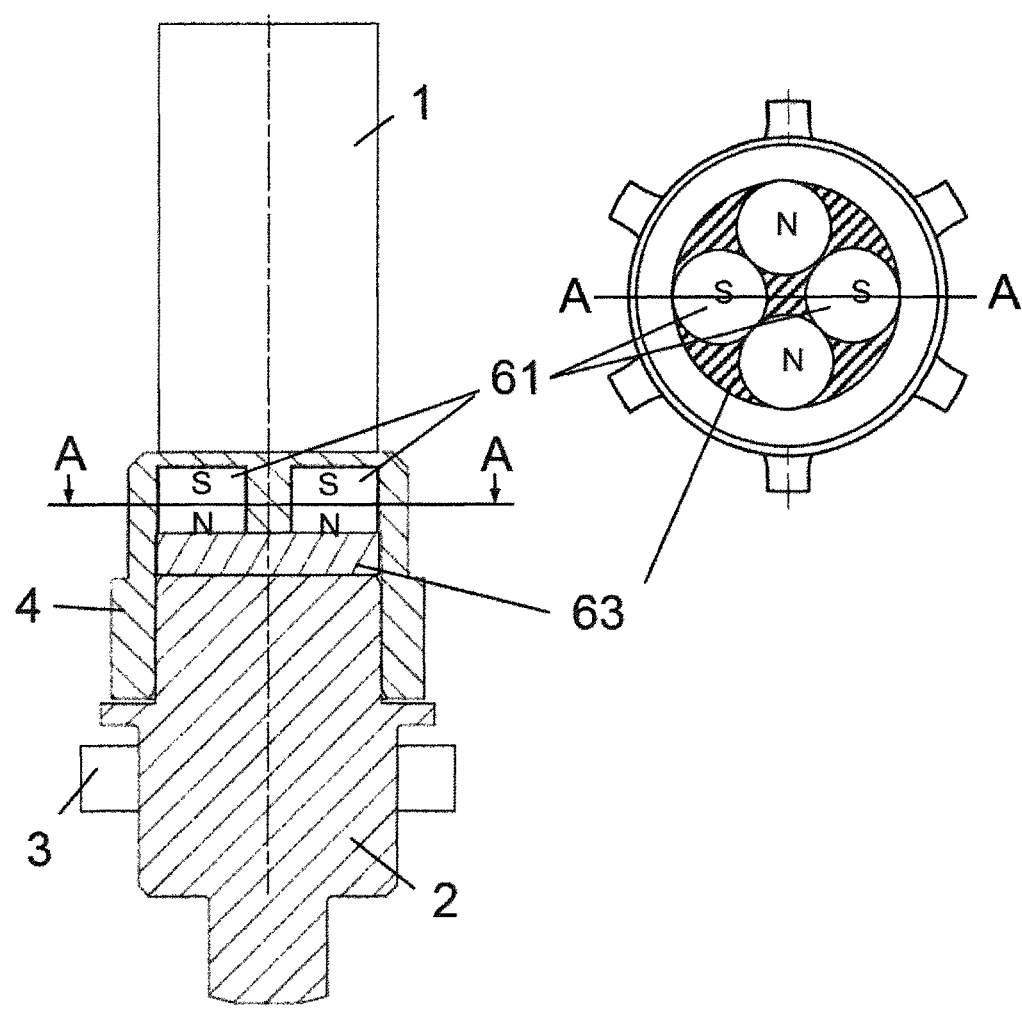

FIG. 4 shows an example of a magnetic fixture with several permanent magnets 61 on a magnet link plate 63 inside the non-magnetic cover 4.

A schematic drawing of a magnetic fixture in FIG. 1 represents the state of the art, where a permanent magnet 51 is assembled on a fixture base 2. The magnet 51 is surrounded in radial direction by a shell 5, whose purpose is not further defined in literature. Such fixtures can be typically loaded in a separate multi-fixture holder plate, which is not shown here. Such holder plates are usually arranged on top of each other and undergo a two-fold rotation in a common batch-type coating machine, as they are fixed on a rotating carousel with fixed transmission. In order to achieve a three-fold rotation, the rotary motion of the two-fold rotating multi-fixture tree is used to rotate the individual magnetic fixtures by stroking a gear ring 3 with a so called "flicker finger".

By using a magnetic fixture assembly as schematically shown in FIG. 1, the coating thickness of the DLC coating is significantly higher at the top of the workpiece, in our example a pin, compared to the surface area that is closer to the contact zone of the magnet fixture. Also the mechanical properties of the DLC coating are significantly different along the main axis of the coated pin, which can lead to premature failure during application.

This negative implications of existing magnetic holders on plasma assisted vacuum processes can be overcome by using the proposed inventive magnetic assemblies, in particular for the deposition of DLC coatings as explained in the following.

The inventors surprisingly found that a significantly lower magnetic field around the workpiece-fixture contact zone is created, while maintaining sufficiently high magnetic holding forces to carry a workpiece 1, if a magnet yoke 6 is installed in the magnet fixture radially separated from the permanent magnet 51 by an air gap 53. A schematic drawing of such an assembly is presented in FIG. 2, where also a non-magnetic cover 4 of the magnet fixture is indicated, and a distal air gap portion 52 of the air gap 53 is disposed between a distal end of the permanent magnet 51 and a distally-located wall 54 of the non-magnetic cover 4.

First tests using a DLC coating process in an Oerlikon Balzers deposition plant have indicated that the homogeneity of the coating properties and thicknesses, as well as adhesion of the DLC coating can significantly be improved compared to a state-of-the-art magnet fixture. It was found that the utilization of a state-of-the-art magnet fixture, that creates a magnetic leak at the contact zone workpiece-fixture, exhibits a coating thickness difference of more than 40% between the thickness of the mantle surface in the topmost region of the workpiece compared to the thickness at the workpiece region closest to the contact zone workpiece-fixture. If the inventive magnet assembly is used in the magnet fixture, a significantly more homogenous distribution of coating thickness with only a variation of equal or less than 20% can be achieved.

According to the present invention, the magnetic holding forces are sufficiently high to enable the positioning of the workpiece upright, meaning the main axis of the coated workpiece is pointing towards the top of the deposition chamber, thus 0°, or in other cases the main workpiece axis is inclined to an arbitrary angle between 0° and 180°, which means that the workpiece can be mounted headfirst.

The strength of a magnetic field can be understood to scale with the gradient of the magnetic field lines. It is thus a preferred embodiment of the present invention that the magnetic field of the fixture-workpiece combination can be mostly confined within the workpiece and adjacent magnet assembly, which avoids unintended side plasmas during plasma assisted vacuum processes, in particular PACVD, and thus improves the coating thickness distribution and coating property homogeneity along the main axis of the workpiece.

In another example of the current invention, a solid non-magnetic spacer material 55, as schematically indicated in FIG. 3, radially separates the permanent magnet 51 from the magnet yoke 6.

The polarities of the magnets 51 can deviate from the orientation shown in FIGS. 2 and 3, respectively, and has to be optimized for the individual plasma assisted vacuum process (e.g. in terms of the workpiece-fixture geometry, used materials, fixture and rotation concept).

The non-magnetic spacer is preferably made of non-magnetic steel, as for instance 1.4301 or 1.4305, but can also be produced of non-magnetic ceramic material or a non-magnetic polymer.

As an embodiment of the current invention the magnet yoke 6 is preferably made of a ferromagnetic material, such as ferritic steel (e.g. 1.0718).

Another embodiment of the invention is that the fixture base 2 is made of stainless, or austenitic, steel. Alternatively the fixture base can also be made of ferritic steel or cast iron, which however requires a careful adaption of the overall magnetic concept of the magnet fixture, fixture mount at the carousel etc., as described below.

The quantitative measurement of a magnetic field is difficult and depends on many factors, like. e.g. the geometry of workpiece, fixture and magnet assembly, as well as the used material combination of workpiece, magnets and other fixture parts, and the measurement method itself. Hence, the inventors believe that the local measured Gauss-value is not suitable to exactly define the claims of the invention.

In order to properly describe the intended claims of the inventive magnet fixture, as well as the corresponding method using the inventive fixture, the characteristics of the coated and/or treated article can be used. Additionally the following embodiment should be regarded as particularly important. It is thus a preferred embodiment of the invention that the geometric relationship between magnet 51, air gap 53 and magnet yoke 6 has to be chosen in a way that the magnetic field is mostly confined within the workpiece-fixture combination so that following conditions are fulfilled:

The magnetic field strength is sufficiently high to fix the workpiece, the magnetic field outside the workpiece is limited in a way that no undesired side plasma is active during plasma treatment and/or deposition, the magnet yoke material is not magnetically saturated.

The same geometric/magnetic relationship applies mutatis mutandis for the situation with magnet yoke 6 and non-magnetic spacer 55.

It is also a preferred embodiment of the current invention that the air gap 53 ensures an equal distance between the magnet 51 and the yoke 6 radially and axially along the symmetry axis of the permanent magnet 51. A contact between magnet and yoke has to be enabled at the bottom side of the magnet in direction away from the workpiece.

The magnetic yoke encloses the permanent magnet only circumferentially but not in direction towards the workpiece. The magnetic field lines thus enter the workpiece at the bottom side of the workpiece, at the contact zone of workpiece-fixture, and also preferably exit at the bottom side in order to create a closed loop of magnetic field lines with the magnet yoke.

Another example, employing the same inventive idea by avoiding unintended side plasmas during plasma assisted vacuum processing, but enabling for even higher holding forces is schematically shown in FIG. 4.

FIG. 4 shows the setup according to another embodiment of the present invention. In order to fix a substrate or part or workpiece 1 on fixtures during deposition, a magnet is needed and the magnet has to be submerged in a non-magnetic cover. As it is better not to detect any magnet field at the outside of the magnet protecting cover 4 except the top face which is in direction towards the workpiece. So it is better to adjust the magnet assembly in a way that a closed loop of magnet lines is created within the combination fixture-workpiece.

As a preferred embodiment a closed loop of magnet lines can be realized if magnets have to be arranged in opposite directions from their neighbored magnets and a magnet link plate (magnetic substance) is placed underneath the magnets. The quantity of arranged magnets has to be of even number.

With the inventive arrangement according to FIG. 4 the magnetic field outside the fixture-workpiece combination was measured and found to be weak. It means that the magnetic field was sufficiently low for avoiding the generation of a side plasma in this region.

Especially when DLC coatings using PACVD are to be applied, the present invention is very advantageous as undesirable side plasmas are avoided. Such undesirable side plasmas typically negatively affect the characteristics of the DLC coatings.

FIG. 4 shows an example of the inventive magnet assembly according to the description above. The magnetic fixture is composed of a plurality of permanent magnets 61, which are submerged in the non-magnetic cover 4 and positioned on a magnet link plate 63. The permanent magnets are arranged pairwise with opposite magnetic polarities, as visible along the cross-section line A-A in the schematic drawing of 4. A good magnetic confinement of the magnetic field can be achieved within the magnetic fixture and the workpiece and simultaneously the magnetic field lines preferably expand only in vertical direction towards the workpiece and towards the magnetic link plate and exhibit thus a magnetic "closed loop".

It is another preferred embodiment that the geometric relationship between magnets 61, the arrangement of alternating polarities of adjacent magnets, the magnet link plate 63, has to be chosen in a way that the magnetic field is mostly confined within the workpiece-fixture combination so that following conditions are fulfilled:
the magnetic field strength is sufficiently high to fix the workpiece,
the magnetic field outside the workpiece is limited in a way that no undesired side plasma is active during plasma treatment and/or deposition,
the magnet link plate material is not magnetically saturated.

It is an embodiment of the invention that the magnetic fixture is covered by a non-magnetic cover, preferably made of a corrosion resistant material such as stainless steel (e.g. 1.4301, 1.4305), that shields the magnet assembly from being coated during deposition and effectively protects the magnet assembly during chemical and/or mechanical cleaning.

In another embodiment of the invention the permanent magnets are made of strong hard magnetic material as e.g. Samarium-Cobalt alloy (SmCo) or the like.

It is another embodiment of the invention that the used permanent magnets exhibit a Curie-Temperature of higher than 450° C. in order to maintain the magnetic forces during a plasma assisted vacuum process. This high Curie-Temperature has the advantage that at lower process temperatures, in particular during deposition of DLC e.g. 250-300° C., the magnetic holding forces are more or less constant.

In another preferred embodiment the magnet link plate is made of steel (i.e. 1.4034) or any comparable magnetic material that allows for a magnetic link.

It is also a preferred embodiment of the present invention that the permanent magnets are arranged adjacent to each other but with alternate polarities. Further the set of magnets used have to be of even number, e.g. 2, 4, etc.

A further preferred embodiment of the present invention is that the coating thickness distribution of the coated parts is within a range of ±20% of the average thickness of the coating along the mantle surface of the workpiece. The mantle surface hereby is defined as the surface of the workpiece along the main rotation axis of the workpiece.

In another preferred embodiment of the present invention the magnetic fixtures can undergo a three-fold rotation with respect to the main axis of the deposition chamber. This achieved that the two-fold rotation of the multi-fixture holder passively triggers the individual three-fold rotation of the individual magnetic fixtures by stroking the gear ring 3 with fixed "flicker fingers". Alternatively, an additional transmission assembly can be used to achieve a three-fold rotation of the magnetic fixtures at a fixed rotation speed. In this case the gear ring 3 is used to rotate the magnetic fixtures in a controlled and continuous manner.

The inventors found that the radial dimension of the inventive magnet assemblies, should be in total equal or slightly less than the radial dimension of the rotary symmetric workpiece. It is thus a preferred embodiment the outer radius of the magnet yoke should be in the range of 100% to 50% of the radial dimension of the workpiece. The inner radius of the magnet yoke, as well as the thickness of the air gap, or non-magnetic spacer, respectively, is defined by its functionality as described above.

The same range applies mutatis mutandis for the outer radial dimension of the above mentioned magnet pairs and the connecting magnet link plate, which should be thus in the range of 100% to 50% of the radial dimension of the workpiece.

In other words, if the workpiece is a pin of diameter 20 mm, the outer radius of the magnet yoke or magnet pairs should be at maximum 10 mm and at minimum 5 mm.

It is thus an embodiment of the invention that the inventive magnet assembly can be used in any sort of reactive or non-reactive plasma assisted vacuum process, in particular treatments like etching, nitriding, carburizing, or coating deposition processes, where a plasma is active at the workpiece surface and side plasmas are unintended.

The utilization of the inventive magnet fixtures turned out to be of particular advantage for the deposition of DLC in PACVD processes.

In particular the present invention discloses:

An inventive fixture system comprising several parts, at least one of the parts being a holding part for holding a workpiece comprising ferromagnetic substances, said workpiece comprising a body with two ends and exhibiting along a rotary axis a symmetric shape with a radial dimension and with surfaces to be treated by means of a plasma assisted vacuum treatment process, said holding part comprising magnetic means which generate a magnetic field with a magnetic force in the rotary axis direction which is high enough for holding the workpiece if the workpiece is placed on a holding surface of the holding part in such a manner that one of its ends is in contact with the holding surface of the holding part, wherein the magnetic means of the holding part are designed and arranged in such a manner that the magnetic field lines of the generated magnetic field are at least largely confined to the space occupied with parts of the fixture system or body of the workpiece, so that a generation of side plasmas caused by the magnetic field lines during the execution of a plasma treatment is avoided.

A preferred embodiment of the inventive fixture system, wherein the holding part comprises a fixture base (2), a magnet yoke (6) comprising an opening, an outer diameter and an inner diameter, said magnet yoke being placed between a surface of the fixture base and the holding surface of the holding part in a manner that said opening is positioned in the opposite side to the fixture base, at least one magnet (51) placed inside the magnet yoke (6) in a manner that the at least one magnet (51) is kept circumferentially at equal distance from the magnet yoke (6) by an air gap (53).

A preferred embodiment of the inventive fixture system, wherein the holding part comprises a fixture base (2), a magnet yoke (6) comprising an opening, an outer diameter and an inner diameter, said magnet yoke being placed between a surface of the fixture base and the holding surface of the holding part in a manner that said opening is positioned in the opposite side to the fixture base, at least one magnet (51) placed inside the magnet yoke (6) in a manner that the at least one magnet (51) is kept circumferentially at equal distance from the magnet yoke (6) by a non-magnetic spacer (55).

A preferred embodiment of any of the inventive fixtures comprising a magnet yoke, wherein the outer radius regarding the outer diameter of the magnet yoke (6) is in the range of 100% to 50% of the radial dimension of the workpiece body.

A further preferred embodiment of the inventive fixture system, wherein the holding part comprises a fixture base (2), a magnet link plate (63) placed between a surface of the fixture base and the holding surface of the holding part, and at least one pair of magnets (61) placed between the magnet link plate (63) and the holding surface of the holding part in a manner that each magnet of said at least one pair of magnets (61) is positioned next to each other with opposite polarities and forming an outer diameter. The outer radius regarding the outer diameter formed by the pair of magnets (61) being preferably in the range of 100% to 50% of the radial dimension of the workpiece body.

A further preferred embodiment of any of the fixture systems described above, wherein the holding part further comprises a non-magnetic cover (4) comprising stainless steel which is used as holding surface.

A further preferred embodiment of any of the fixture systems described above, wherein one or more magnets comprised in the holding part are permanent magnets which are made of hard magnetic material. The hard magnetic material has preferably a Curie-Temperature of above 450° C.

An inventive method for plasma treatment of at least one workpiece having a body comprising ferromagnetic substances and two ends and exhibiting along a rotary axis a symmetric shape with a radial dimension and with surfaces to be treated by means of a plasma assisted vacuum treatment process, comprising the generation of plasma in the proximity of the substrate, wherein a fixture system according to any of the preceding claims 1 to 10 is used for holding the workpieces during the execution of the plasma assisted vacuum treatment process which comprises the generation of plasma in the proximity of the surfaces to be treated and by using said fixture system a generation of side plasmas caused by magnetic field lines produced by magnetic means comprised in the fixture system during the execution of a plasma treatment is avoided.

A further embodiment of the inventive method described above, wherein the process comprises a coating process carried out for depositing at least one coating layer along a mantle surface of the workpiece to be coated by means of a plasma assisted vacuum deposition process, in particular a PA-CVD process, said coating process comprising the generation of plasma in the proximity of the surface to be coated, wherein by using said fixture system a generation of side plasmas caused by magnetic field lines produced by magnetic means comprised in the fixture system, which can affect the properties of the coating layer deposited along the surfaces to be coated, is avoided.

A further preferred embodiment of an inventive method, wherein the workpieces are rotated symmetrically regarding at least one axis during the execution of the process.

Using any of the inventive methods described above for treating or coating workpieces which are components or automotive parts, especially pins, needles, plungers.

A method according to any of the embodiments described above comprising a coating step, in which the workpieces are coated with a coating layer exhibiting a layer thickness variation of equal or less than 20% compared to the mean coating layer thickness measured at the mantle surface of the workpiece.

A method according to any of the embodiments described above comprising a coating step, in which the workpieces are coated with a coating layer exhibiting a layer hardness variation of equal or less than 20% compared to the mean coating layer hardness measured at the mantle surface of the workpiece.

What is claimed is:

1. A fixture system comprising a holding part for holding a workpiece comprising ferromagnetic substances, said workpiece comprising a body with two ends and exhibiting along a rotary axis a symmetric shape with a radial dimension and with surfaces to be treated by means of a plasma assisted vacuum treatment process, said holding part comprising a magnetic means which generates a magnetic field with a magnetic force in the rotary axis direction which is high enough for holding the workpiece if the workpiece is placed on a holding surface of the holding part in such a manner that one end of the workpiece is in contact with the holding surface of the holding part, the holding part further comprising:
   a magnetic yoke having an open cavity with an open end and a closed end,
   the magnetic means of the holding part positioned in the open cavity of the magnetic yoke wherein a distal end of the magnetic means includes one pole oriented toward the open end of the open cavity and a proximal end of the magnetic means includes an opposite pole oriented toward the closed end of the open cavity, the magnetic means designed and arranged in such a manner that the magnetic field lines of the generated magnetic field are at least largely confined to the space occupied with parts of the fixture system or body of the workpiece, so that a generation of side plasmas caused by the magnetic field lines during the execution of a plasma treatment is avoided, and
   a non-magnetic cover comprising stainless steel and having a first surface defining the holding surface, and an opposite second surface closing the open cavity of the magnetic yoke,
   wherein an air gap is disposed circumferentially between the magnetic means and the magnetic yoke, and between the distal end of the magnetic means and the opposite second surface of the non-magnetic cover, and further between the open end of the magnetic yoke and the opposite second surface of the non-magnetic cover.

2. A fixture system according to claim 1, wherein the holding part further comprises a fixture base, the magnet yoke having an outer diameter and an inner diameter, said magnet yoke being placed between a surface of the fixture base and the holding surface of the holding part in a manner that said open cavity is positioned in the opposite side to the fixture base, and the magnetic means including at least one magnet placed inside the open cavity of the magnet yoke in a manner that the at least one magnet is kept circumferentially at equal distance from the magnet yoke by the air gap.

3. A fixture system according to claim 2, wherein an outer radius regarding the outer diameter of the magnet yoke is in the range of 100% to 50% of a radial dimension of the workpiece body.

4. A fixture system according to claim 1, wherein one or more magnets of the magnetic means comprised in the holding part are permanent magnets which are made of hard magnetic material.

5. A fixture system according to claim 4, wherein the hard magnetic material has a Curie-Temperature of above 450° C.

6. Method for plasma treatment of a workpiece having a body comprising ferromagnetic substances and two ends and exhibiting along a rotary axis a symmetric shape with a radial dimension and with surfaces to be treated by means of a plasma assisted vacuum treatment process, comprising the generation of plasma in the proximity of the workpiece, wherein a fixture system according to claim 1 is used for holding the workpiece during the execution of the plasma assisted vacuum treatment process which comprises the generation of plasma in the proximity of the surfaces to be treated and by using said fixture system a generation of side plasmas caused by magnetic field lines produced by the magnetic means comprised in the fixture system during the execution of a plasma treatment is avoided.

7. Method according to claim 6, wherein the process comprises a coating process carried out for depositing at least one coating layer along a mantle surface of the workpiece to be coated by means of a plasma assisted vacuum deposition process, said coating process comprising the generation of plasma in the proximity of the surface to be coated, wherein by using said fixture system a generation of side plasmas caused by magnetic field lines produced by the magnetic means comprised in the fixture system, which can affect the properties of the coating layer deposited along the surfaces to be coated, is avoided.

8. Method according to claim 6, wherein the workpiece is rotated symmetrically regarding at least one axis during the execution of the process.

9. Method according to claim 6, wherein the workpiece is a component or automotive part.

10. Method according to claim 7, wherein workpiece is coated with at least one coating layer exhibiting a layer thickness variation of equal or less than 20% compared to the mean coating layer thickness measured at the mantle surface of the workpiece.

11. Method according to claim 7, wherein the workpiece is coated with at least one coating layer exhibiting a layer hardness variation of equal or less than 20% compared to the mean coating layer hardness measured at the mantle surface of the workpiece.

12. A fixture system according to claim 1, wherein the magnetic means has a circumference extending along a length, and wherein the air gap extends along a majority but not a full extent of the length.

13. A fixture system according to claim 1, wherein the non-magnetic cover includes a cavity that receives the magnet yoke and the magnetic means, wherein the opposite second surface of the non-magnetic cover defines a surface of the cavity.

14. A fixture system according to claim 1, wherein the magnetic means are separated by the non-magnetic cover from the workpiece to be held.

15. A deposition chamber for plasma assisted vacuum treatment system, in combination with a fixture system according to claim 1, wherein the fixture system is movable relative to the deposition chamber.

16. A fixture system according to claim 1, wherein the air gap is disposed about a majority of an outer surface area of the magnetic means.

* * * * *